(12) United States Patent
Paek et al.

(10) Patent No.: US 12,439,755 B2
(45) Date of Patent: Oct. 7, 2025

(54) DISPLAY DEVICE AND MANUFACTURING METHOD THEREOF

(71) Applicant: LG DISPLAY CO., LTD., Seoul (KR)

(72) Inventors: SeungHan Paek, Seoul (KR); HyunJin An, Gyeonggi-do (KR); Kyungjae Yoon, Seoul (KR); Jeonphill Han, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 528 days.

(21) Appl. No.: 17/939,419

(22) Filed: Sep. 7, 2022

(65) Prior Publication Data

US 2023/0216005 A1 Jul. 6, 2023

(30) Foreign Application Priority Data

Dec. 30, 2021 (KR) .................. 10-2021-0192352

(51) Int. Cl.
*H10H 20/857* (2025.01)
*H10H 20/01* (2025.01)
*H10H 20/84* (2025.01)

(52) U.S. Cl.
CPC .......... *H10H 20/857* (2025.01); *H10H 20/01* (2025.01); *H10H 20/84* (2025.01); *H10H 20/034* (2025.01); *H10H 20/0364* (2025.01)

(58) Field of Classification Search
CPC ...... H10H 20/857; H10H 20/01; H10H 20/84; H10H 20/034; H10H 20/0364; H10K 59/1201; H10K 71/851; H10K 71/70; H10K 59/131; H10K 50/841; H10K 71/00; H01L 25/0753; H01L 22/32; G09F 9/33; G09F 9/335; G09F 9/35
See application file for complete search history.

(56) References Cited

U.S. PATENT DOCUMENTS

| | | | | |
|---|---|---|---|---|
| 2014/0319471 A1* | 10/2014 | Kim | .................. | H10K 71/70 438/18 |
| 2020/0358028 A1* | 11/2020 | Hwang | .............. | H10K 59/8722 |
| 2021/0110745 A1* | 4/2021 | Jung | .................. | G01M 5/0033 |
| 2021/0134197 A1* | 5/2021 | Ju | .......................... | G09G 3/006 |
| 2023/0006120 A1* | 1/2023 | Jung | .................. | H01L 25/0753 |
| 2023/0041278 A1* | 2/2023 | Saitoh | .................... | G09F 9/30 |
| 2023/0209885 A1* | 6/2023 | Paek | ................... | G02B 5/3033 359/483.01 |
| 2024/0215422 A1* | 6/2024 | Yuan | .................... | G02F 1/1362 |

* cited by examiner

*Primary Examiner* — Victor A Mandala
(74) *Attorney, Agent, or Firm* — Morgan, Lewis & Bockius LLP

(57) ABSTRACT

A display device may include a substrate including a display area and non-display area, a signal line disposed in the display area of the substrate, a test line disposed in the non-display area and connected to the signal line, and a first lower etching stopper layer disposed between the substrate and the test line. A rear surface edge of the substrate may be located further inside than an outer side edge of the first lower etching stopper layer. An end portion of the test line may include a portion that is located further outside than the rear surface edge of the substrate and does not overlap the substrate.

10 Claims, 20 Drawing Sheets

DISPLAY DEVICE AND MANUFACTURING METHOD THEREOF

CROSS-REFERENCE TO RELATED APPLICATION

This application claims the benefit of and priority to Korean Patent Application No. 10-2021-0192352, filed on Dec. 30, 2021, the entirety of which is incorporated herein by reference for all purposes as if fully set forth herein.

BACKGROUND

1. Technical Field

The present disclosure relates to devices and methods and particularly to, for example, without limitation, a display device and a manufacturing method thereof.

2. Discussion of the Related Art

As information society develops, the demand for display devices for displaying images increases in various forms, and in recent years, various display devices such as liquid crystal display devices and organic light emitting display devices have been utilized.

Meanwhile, during a process of manufacturing a display device, a test process (which may be referred to as an auto probe process) may be performed to test whether a display panel is normally driven and normally lit. For this test process, test pads connected to signal lines related to driving are required.

In a field of display device manufacturing technology, when a test process is to be performed during a manufacturing process of a display device, test pads connected to driving-related signal lines disposed on a display panel are placed inside the display panel, and then the test process is performed. In this case, the test pads remain on the display panel even after the manufacturing process is finally completed. For this reason, there may be restrictions on implementation of a narrow bezel design of the display device. In addition, when the display device has a structure in which the test pads are disposed inside the display panel, there may also be a problem in that the manufacturing process of the display device may become complicated.

The description provided in the discussion of the related art section should not be assumed to be prior art merely because it is mentioned in or associated with that section. The discussion of the related art section may include information that describes one or more aspects of the subject technology.

SUMMARY

The inventors of the present disclosure have recognized the problems and disadvantages of the related art and have performed extensive research and experiments. The inventors of the present specification have thus invented a new structure that can simplify the manufacturing process without leaving the test pads on a substrate of the display panel when the manufacturing process is finally completed, and have invented a display device including a new structure that substantially obviates one or more problems due to limitations and disadvantages of the related art.

Accordingly, exemplary embodiments of the present disclosure may provide a manufacturing method of a display device having a structure in which no test pads remain on a substrate of a display panel on which the manufacturing is finally completed, and a display device manufactured by the manufacturing method.

Exemplary embodiments of the present disclosure may provide a manufacturing method of a display device having a structure that can simplify a manufacturing process of the display device when a test process is performed during the manufacturing process of the display device, and a display device manufactured by the manufacturing method.

Exemplary embodiments of the present disclosure may provide a manufacturing method of a display device having a structure that can facilitate a cutting process during a manufacturing process of the display device, and a display device manufactured by the manufacturing method.

Exemplary embodiments of the present disclosure may provide a manufacturing method of a display device having a structure that can significantly reduce the possibility that main lines may be damaged by etching or other operations during a manufacturing process of the display device, and a display device manufactured by the manufacturing method.

Exemplary embodiments of the present disclosure may provide a manufacturing method of a display device having a structure that can significantly reduce the possibility that a display panel may be damaged by cracks, and a display device manufactured by the manufacturing method.

A display device according to exemplary embodiments of the present disclosure may include a substrate including a display area and a non-display area, a signal line disposed in the display area of the substrate, a test line disposed in the non-display area of the substrate and connected to the signal line, and a first lower etching stopper layer disposed between the substrate and the test line.

In the display device according to the exemplary embodiments of the present disclosure, a rear surface edge of the substrate may be located further inside than an outer side edge of the first lower etching stopper layer, and an end portion of the test line may include a portion that is located further outside than the rear surface edge of the substrate and does not overlap the substrate.

The display device according to the exemplary embodiments of the present disclosure may further include a back coating film disposed on the rear surface of the substrate and including an organic film.

In the display device according to the exemplary embodiments of the present disclosure, the rear surface edge of the substrate may have a tapered shape.

In the display device according to the exemplary embodiments of the present disclosure, a rear surface edge of the back coating film may not have a tapered shape at a predetermined angle but may have a right angle shape, or the rear surface edge of the back coating film may have the same tapered shape as the rear surface edge of the substrate.

In the display device according to the exemplary embodiments of the present disclosure, a side edge of the first lower etching stopper layer may have a tapered shape only up to a predetermined height from the rear surface thereof.

The display device according to the exemplary embodiments of the present disclosure may further include an inorganic insulating film disposed on the test line, and the signal line may be disposed on the inorganic insulating film and connected to the test line via a through hole of the inorganic insulating film.

The display device according to the exemplary embodiments of the present disclosure may further include a second lower etching stopper layer disposed between the first lower etching stopper layer and the test line.

In the display device according to the exemplary embodiments of the present disclosure, an outer side edge of the test line may have a cut surface in a cut form, and the cut surface of the outer side edge of the test line may be in a state of being aligned with a cut surface of the outer side surface of the first lower etching stopper layer or the second lower etching stopper layer.

The display device according to the exemplary embodiments of the present disclosure may further include an upper etching stopper layer disposed on the signal line.

In the display device according to the exemplary embodiments of the present disclosure, each of the first lower etching stopper layer and the second lower etching stopper layer may include an inorganic film, and the upper etching stopper layer may include an organic film.

A display device according to exemplary embodiments of the present disclosure may include a substrate including a display area and a non-display area, a first lower etching stopper layer disposed on the substrate, and a back coating film disposed on a rear surface and an outer side surface of the substrate.

In the display device according to the exemplary embodiments of the present disclosure, an outer side edge of the back coating film may be located further outside than a rear surface edge of the substrate.

In the display device according to the exemplary embodiments of the present disclosure, the back coating film may include an organic film.

In the display device according to the exemplary embodiments of the present disclosure, the rear surface edge of the substrate may have a tapered shape.

In the display device according to the exemplary embodiments of the present disclosure, the rear surface edge of the back coating film may not have a tapered shape at a predetermined angle but may have a right angle shape, or the rear surface edge of the back coating film may have the same tapered shape as the rear surface edge of the substrate.

The display device according to the exemplary embodiments of the present disclosure may further include an upper etching stopper layer disposed on the first lower etching stopper layer.

In the display device according to the exemplary embodiments of the present disclosure, a partial upper surface of the back coating film may be in contact with a partial rear surface of the upper etching stopper layer.

In the display device according to the exemplary embodiments of the present disclosure, the first lower etching stopper layer may include an inorganic film, and the upper etching stopper layer may include an organic film.

The display device according to the exemplary embodiments of the present disclosure may further include an intermediate etching stopper layer disposed between the first lower etching stopper layer and the upper etching stopper layer, and the intermediate etching stopper layer may include a metal film.

A manufacturing method of a display device according to exemplary embodiments of the present disclosure may include: disposing a first lower etching stopper layer on a mother substrate; disposing a test line on the first lower etching stopper layer; disposing an inorganic insulating film on the test line; forming through holes of the inorganic insulating film; disposing a signal line and a test pad on the inorganic insulating film, and connecting the signal line with one end of the test line via a through hole of the inorganic insulating film and connecting the test pad with the other end of the test line via another through hole of the inorganic insulating film; and separating the mother substrate into a substrate and a test pad substrate by etching a rear surface of the mother substrate to form an etching hole.

The manufacturing method of a display device according to the exemplary embodiments of the present disclosure may further include coating a back coating film on rear surfaces of the substrate and the test pad substrate.

The manufacturing method of a display device according to the exemplary embodiments of the present disclosure may further include: performing an auto probe process through the test line after separating the mother substrate into the substrate and the test pad substrate; and removing the test pad substrate by performing a cutting process along a cutting line corresponding to the etching hole. Here, an inner side surface of the etching hole in the rear surface of the substrate may have a tapered shape.

The manufacturing method of a display device according to the exemplary embodiments of the present disclosure may further include disposing a second lower etching stopper layer between the first lower etching stopper layer and the test line after disposing the first lower etching stopper layer.

The manufacturing method of a display device according to the exemplary embodiments of the present disclosure may further include disposing an upper etching stopper layer on the signal line after the operation of connecting the signal line with the test line.

According to exemplary embodiments of the present disclosure, a manufacturing method of a display device having a structure (e.g., an external test pad arrangement structure) in which no test pads remain on a substrate of a display panel on which the manufacturing is finally completed, and a display device manufactured by the manufacturing method can be provided.

According to exemplary embodiments of the present disclosure, when a test process is performed during a manufacturing process of a display device, a manufacturing method of the display device having a structure that can simplify the manufacturing process of the display device, and a display device manufactured by the manufacturing method can be provided.

According to exemplary embodiments of the present disclosure, a manufacturing method of a display device having a structure (e.g., a substrate etching hole structure) that can facilitate a cutting process during a manufacturing process of the display device, and a display device manufactured by the manufacturing method can be provided.

According to exemplary embodiments of the present disclosure, a manufacturing method of a display device having a structure (e.g., an etching stopper layer structure) that can significantly reduce the possibility that main lines may be damaged by etching or other operations during a manufacturing process of the display device, and a display device manufactured by the manufacturing method can be provided.

According to exemplary embodiments of the present disclosure, a manufacturing method of a display device having a structure (e.g., a back coating structure) that can significantly reduce the possibility that a display panel may be damaged by cracks, and a display device manufactured by the manufacturing method can be provided.

Additional features, advantages, and aspects of the present disclosure are set forth in part in the description that follows and in part will become apparent from the present disclosure or may be learned by practice of the inventive concepts provided herein. Other features, advantages, and aspects of the present disclosure may be realized and attained by the descriptions provided in the present disclosure, or derivable therefrom, and the claims hereof as well as the appended drawings. It is intended that all such features, advantages, and aspects be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing description and the following description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate embodiments of the disclosure, and together with the description serve to explain principles of the disclosure.

Figure 1:
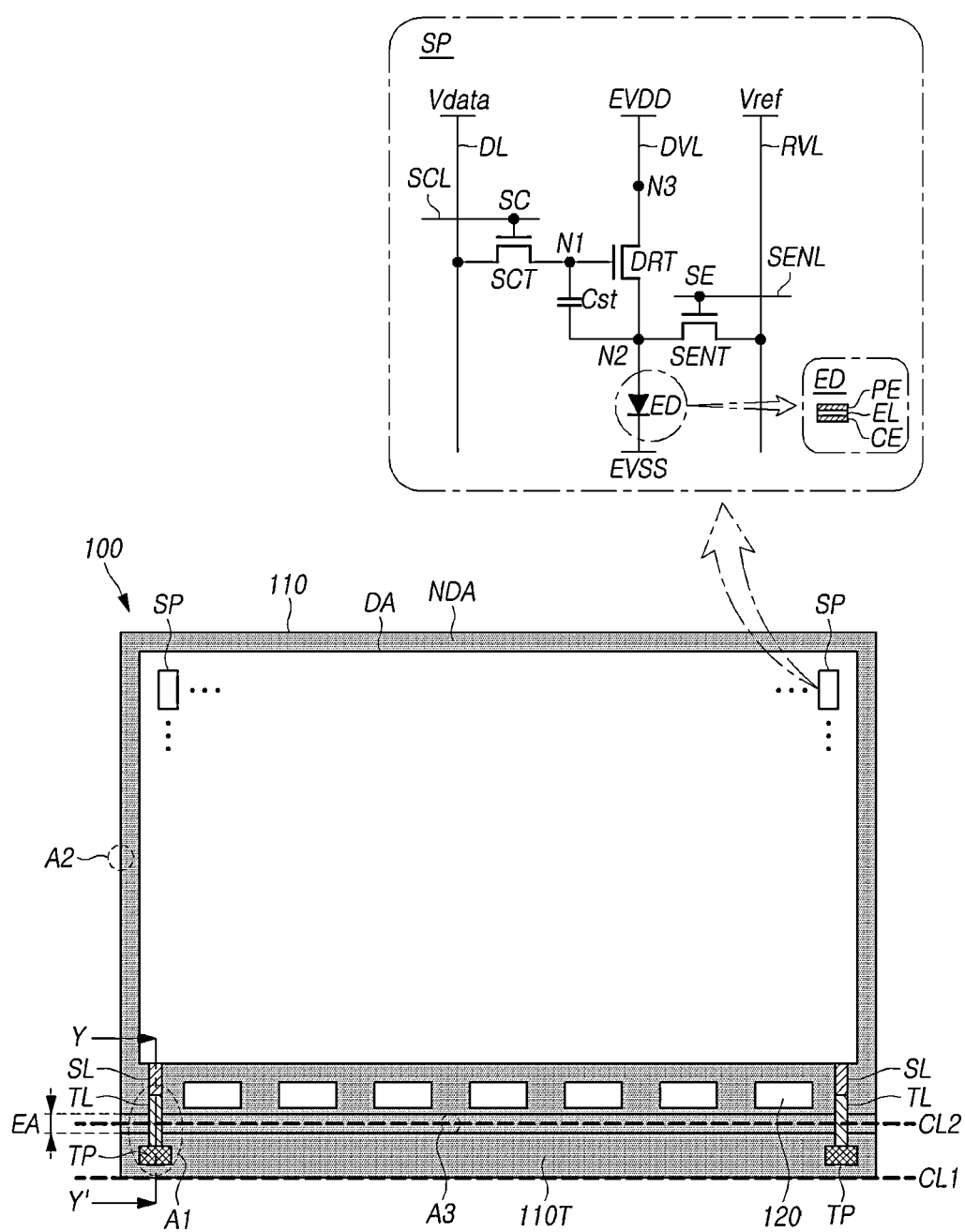
FIG. 1 is a plan view of a display device according to exemplary embodiments of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

In the following description of example embodiments of the present disclosure, reference is made to the accompanying drawings in which it is shown by way of illustration specific examples or embodiments that can be implemented, and in which unless stated otherwise, the same reference numerals and signs can be used to designate the same or like components even when they are shown in different accompanying drawings from one another. Further, in the following description of examples or embodiments of the present disclosure, when a detailed description of well-known functions or configurations may unnecessarily obscure aspects of the present disclosure, the detailed description thereof may be omitted. The progression of processing steps and/or operations described is an example; however, the sequence of steps and/or operations is not limited to that set forth herein and may be changed, with the exception of steps and/or operations necessarily occurring in a particular order.

Like reference numerals refer to like elements throughout unless stated otherwise. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through following embodiments described with reference to the accompanying drawings. The present disclosure may, however, be embodied in different forms and should not be construed as limited to the embodiments set forth herein. Rather, these embodiments are provided so that this disclosure is thorough and complete and fully conveys the scope of the present disclosure to those skilled in the art. Furthermore, the present disclosure is only defined by claims and their equivalents.

The shapes, sizes, areas, ratios, angles, numbers, and the like disclosed in the drawings for describing embodiments of the present disclosure are merely examples, and thus, the present disclosure is not limited to the illustrated details.

When the term "comprise," "have," "include," "contain," "constitute," "make up of," "formed of," or the like is used, one or more other elements may be added unless a term such as "only" or the like is used. The terms of a singular form may include plural forms unless the context clearly indicates otherwise. The word "exemplary" is used to mean serving as an example or illustration. Any implementation described herein as an "example" is not necessarily to be construed as preferred or advantageous over other implementations.

In construing an element, the element is construed as including an error or tolerance range even where no explicit description of such an error or tolerance range is provided.

Where positional relationships are described, for example, where the positional relationship between two parts is described using "on," "over," "under," "above," "below," "beneath," "near," "close to," or "adjacent to," "beside," "next to," or the like, one or more other parts may be located between the two parts unless a more limiting term, such as "immediate(ly)," "direct(ly)," or "close(ly)," is used. For example, when a structure is described as being positioned "on," "over," "under," "above," "below," "beneath," "near," "close to," or "adjacent to," "beside," or "next to" another structure, this description should be construed as including a case in which the structures contact each other as well as a case in which one or more additional structures are disposed or interposed therebetween. Furthermore, the terms "front," "rear," "back," "left," "right," "top," "bottom," "downward," "upward," "upper," "lower,"

"up," "down," "column," "row," "vertical," "horizontal," and the like refer to an arbitrary frame of reference.

In describing a temporal relationship, when the temporal order is described as, for example, "after," "subsequent," "next," "before," "preceding," "prior to," or the like, a case that is not continuous or not sequential may be included unless a more limiting term, such as "just," "immediate(ly)," or "direct(ly)," is used.

It is understood that, although the term "first," "second," or the like may be used herein to describe various elements, these elements should not be limited by these terms. These terms are only used to distinguish one element from another. For example, a first element could be a second element, and, similarly, a second element could be a first element, without departing from the scope of the present disclosure.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers disposed or interposed between the elements or layers, unless otherwise specified.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The term "at least one" should be understood as including any and all combinations of one or more of the associated listed items. For example, the meaning of "at least one of a first item, a second item, and a third item" denotes the combination of items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C.

In one or more aspects, the terms "between" and "among" may be used interchangeably simply for convenience. For example, an expression "between a plurality of elements" may be understood as between a plurality of elements or among a plurality of elements. For example, an expression "among a plurality of elements" may be understood as between a plurality of elements or among a plurality of elements. In one or more examples, the number of elements may be two. In one or more examples, the number of elements may be more than two.

Features of various embodiments of the present disclosure may be partially or wholly coupled to or combined with each other and may be variously inter-operated, linked or driven together. The embodiments of the present disclosure may be carried out independently from each other or may be carried out together in a co-dependent or related relationship. In one or more aspects, the components of each apparatus according to various embodiments of the present disclosure are operatively coupled and configured. Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

In addition, when any dimensions, relative sizes, or the like are mentioned, it should be considered that numerical values for elements, features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can." In addition, for convenience of description, a scale, size, and thickness of each of the elements illustrated in the accompanying drawings may differ from an actual scale, size, and thickness, and thus, embodiments of the present disclosure are not limited to a scale, size, and thickness illustrated in the drawings.

Hereinafter, various exemplary embodiments of the present disclosure will be described in detail with reference to the accompanying drawings.

Figure 2:
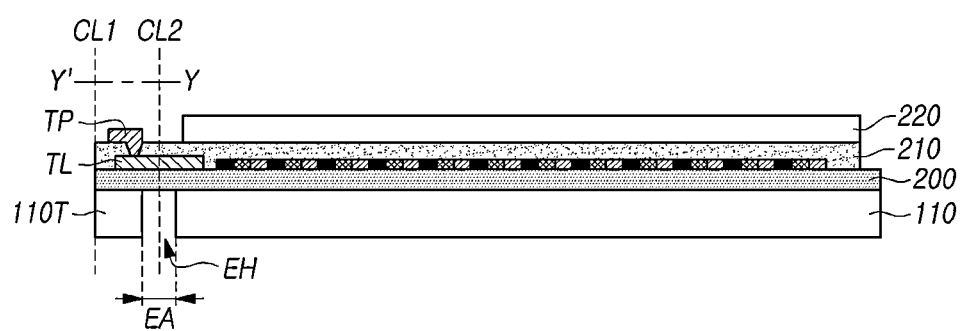
FIG. 2 is a cross-sectional view of the display device according to exemplary embodiments of the present disclosure.

FIGS. 1 and 2 are a plan view and a cross-sectional view of a display device according to exemplary embodiments of the present disclosure. However, the display device illustrated in FIGS. 1 and 2 is not in a state in which manufacturing is completed, but in a state before manufacturing is completed.

Referring to FIGS. 1 and 2, the display device according to the exemplary embodiments of the present disclosure may include a display panel 100 including a display area DA and a non-display area NDA, a driving circuit 120 connected to the non-display area NDA of the display panel 100, and the like.

Referring to FIGS. 1 and 2, in the display panel 100 of the display device according to the exemplary embodiments of the present disclosure, a plurality of sub-pixels SP may be disposed in the display area DA, and a plurality of signal lines SL configured to drive the plurality of sub-pixels may be disposed.

The plurality of signal lines SL may include a plurality of data lines DL, a plurality of gate lines SCL and SENL, and the like. The plurality of signal lines SL may further include power lines such as a plurality of driving voltage lines DVL and a plurality of reference voltage lines RVL.

The display device according to the exemplary embodiments of the present disclosure may be a display including a backlight unit such as a liquid crystal display device, or the like, and may be a self-luminous display such as an organic light emitting diode (OLED) display, a quantum dot display, a micro light emitting diode (micro-LED) display, or the like.

When the display device according to the exemplary embodiments of the present disclosure is a self-luminous display, each of the plurality of sub-pixels SP disposed on the display panel 100 of the display device may include a light emitting element ED, a driving transistor DRT, a scan transistor SCT, a storage capacitor Cst, and the like.

The light emitting element ED may include a pixel electrode PE and a common electrode CE, and may include an emission layer EL positioned between the pixel electrode PE and the common electrode CE.

The pixel electrode PE of the light emitting element ED may be an electrode disposed in each of the sub-pixels SP, and the common electrode CE may be an electrode commonly disposed in all of the sub-pixels SP. Here, the pixel electrode PE may be an anode electrode and the common electrode CE may be a cathode electrode. Conversely, the pixel electrode PE may be a cathode electrode and the common electrode CE may be an anode electrode.

For example, the light emitting element ED may be an organic light emitting diode (OLED), an inorganic material-based light emitting diode (LED), or a quantum dot light emitting element.

The driving transistor DRT, as a transistor configured to drive the light emitting element ED, may include a first node N1, a second node N2, a third node N3, and the like.

The first node N1 of the driving transistor DRT may be a gate node of the driving transistor DRT, and may be electrically connected to a source node or a drain node of the scan transistor SCT. The second node N2 of the driving transistor DRT may be a source node or a drain node of the driving transistor DRT, and may be electrically connected to a source node or a drain node of a sensing transistor SENT, and may also be electrically connected to the pixel electrode PE of the light emitting element ED. The third node N3 of the driving transistor DRT may be electrically connected to the driving voltage line DVL configured to supply a driving voltage EVDD.

The scan transistor SCT may be turned on or turned off according to a scan signal SC supplied from a scan signal line SCL which is a type of the gate line GL, and may control a connection between the data line DL and the first node N1 of the driving transistor DRT.

The storage capacitor Cst may be connected between the first node N1 and the second node N2 of the driving transistor DRT. The storage capacitor Cst may be charged with an amount of charge corresponding to a voltage difference between both ends thereof, and may serve to maintain the voltage difference between both ends thereof during a predetermined frame time. Accordingly, the corresponding sub-pixels SP may emit light during the predetermined frame time.

Each of the plurality of sub-pixels SP disposed on the display panel 100 of the display device according to the exemplary embodiments of the present disclosure may further include the sensing transistor SENT.

The sensing transistor SENT may be turned on or turned off according to a sense signal SE supplied from a sense signal line SENL, which is another type of the gate line GL, and may control a connection between the reference voltage line RVL and the second node N2 of the driving transistor DRT.

Each of the driving transistor DRT, the scan transistor SCT, and the sensing transistor SENT may be an n-type transistor or a p-type transistor. The storage capacitor Cst may not be a parasitic capacitor (e.g., Cgs, Cgd), which is an internal capacitor present between the gate node and the source node (or drain node) of the driving transistor DRT, but may be an external capacitor intentionally designed outside the driving transistor DRT.

The scan signal line SCL and the sense signal line SENL may be different gate lines GL. Alternatively, the scan signal line SCL and the sense signal line SENL may be the same gate line GL. The structure of the sub-pixels SP shown in FIG. 1 is merely an example, and may be variously modified by further including one or more transistors or further including one or more capacitors.

Meanwhile, during a manufacturing process of the display panel 100 of the display device, an auto probe process may be performed to check whether the plurality of signal lines SL transmit the corresponding signals properly or whether the plurality of sub-pixels SP are normally (or correctly) driven to emit light.

To this end, as shown in FIG. 1, the display panel 100 may include a substrate 110 including the display area DA and the non-display area NDA, the plurality of signal lines SL disposed in the display area DA of the substrate 110, and a plurality of test lines TL disposed in the non-display area NDA of the substrate 110 and connected to the plurality of signal lines SL. Here, for example, the substrate 110 may be a glass substrate or a plastic substrate.

Before the panel manufacturing is completed, a test pad substrate 110T spaced apart from the substrate 110 may be present, and a plurality of test pads TP may be disposed on the test pad substrate 110T.

The plurality of signal lines SL may include the plurality of data lines DL, the plurality of gate lines SCL and SENL, and the like. The plurality of signal lines SL may further include power lines such as the plurality of driving voltage lines DVL and the plurality of reference voltage lines RVL. The signal line SL disposed in the display area DA of the substrate 110 may be extended to the non-display area NDA and electrically connected to the driving circuit 120.

Meanwhile, during the panel manufacturing process according to the exemplary embodiments of the present disclosure, for process simplification, and the like, a test structure may be designed such that the test pads TP are disposed outside the display panel 100 after the panel manufacturing is completed. To this end, the exemplary embodiments of the present disclosure disclose a unique manufacturing method of a display device (display panel), and a substrate etching structure and an etching stopper structure suitable therefor.

As a manufacturing process of a display device according to exemplary embodiments of the present disclosure, a mother substrate manufacturing process, a primary cutting process, an auto probe process, a secondary cutting process, a module input process, and the like may be performed.

Referring to FIGS. 1 and 2, the mother substrate manufacturing process may be a process of forming metals corresponding to various electrodes or lines, and various insulating films on a mother substrate. In this case, the signal lines SL, the test lines TL, and the test pads TP may be patterned on the mother substrate for each panel unit area.

Referring to FIGS. 1 and 2, during the mother manufacturing process, a partial area EA of the mother substrate (which may be sometimes referred to as an etching area) may be etched for each panel unit area. Accordingly, for each panel unit area, an etching hole EH may be formed in the etching area EA of the mother substrate and the test pad substrate 110T spaced apart from the substrate 110 may be formed.

In one or more example embodiments of the present disclosure, the substrate 110 may be a substrate included in the display panel 100 in a state in which the panel manufacturing is completed (e.g., the substrate 110 may be a substrate included in the display panel 100 when or after the panel manufacturing is completed), and the test pad substrate 110T may be a substrate which is present only during the panel manufacturing process and which is not present in a state in which the panel manufacturing is completed (e.g., the test pad substrate 110T is not present when or after the panel manufacturing is completed). The substrate 110 and the test pad substrate 110T may be portions of the mother substrate, which is separated by an etching process during the panel manufacturing process.

Referring to FIGS. 1 and 2, the etching area EA of the mother substrate refers to an area between the substrate 110 and the test pad substrate 110T, and no substrate is present in this etching area EA. The etching hole EH of the mother substrate formed in the etching area EA may be formed at a position corresponding to a secondary cutting line CL2 to be subjected to the secondary cutting process. As described above, since no substrate is present at the secondary cutting line CL2 to be subjected to the secondary cutting process, the secondary cutting process may be facilitated.

Referring to FIGS. 1 and 2, the test pads TP for the auto probe may be disposed on the test pad substrate 110T, and the test lines TL disposed on the substrate 110 and the test pad substrate 110T may be connected to the test pads TP.

Since the test pad substrate 110T is present only during the panel manufacturing process and is not present in the state in which the panel manufacturing is completed, the test pads TP disposed on the test pad substrate 110T are also not present in the final display panel 100 after the panel manufacturing is completed.

Referring to FIGS. 1 and 2, the primary cutting process may be a process of separating the plurality of display panels 100 from the mother substrate by cutting the mother substrate along a primary cutting line CL1.

After the primary cutting process, the substrate 110 and the test pad substrate 110T may be present as a set for each panel unit.

After the primary cutting process, the test pads TP for the auto probe may be disposed on the test pad substrate 110T adjacent to the substrate 110 of the separated display panel 100, and the test lines TL disposed on the substrate 110 and the test pad substrate 110T may be present in a state of still being connected to the test pads TP.

Referring to FIGS. 1 and 2, the auto probe process may be a test process to check whether a test signal is supplied to the signal lines SL through the test pads TP and the sub-pixels SP are normally (or correctly) driven to emit light, and may also be a test process capable of testing an electrical state of the signal lines SL through the test pads TP.

Referring to FIGS. 1 and 2, in the secondary cutting process, after the auto probe process is completed, the substrate 110 and the test pad substrate 110T may be separated by cutting the display panel 100 along the secondary cutting line CL2 corresponding to the etching hole EH of the substrate 110. Here, the secondary cutting line CL2 may correspond to the etching area EA, that is, an etching hole formation area. The secondary cutting line CL2 may correspond to an outer edge of the display panel 100 in the state in which the panel manufacturing is finally completed.

Referring to FIGS. 1 and 2, the module input process may be a process of completing the manufacturing of the display panel 100 and the display device after the secondary cutting process.

Referring to FIGS. 1 and 2, in the manufacturing process of the display panel 100 of the display device according to the exemplary embodiments of the present disclosure, a position of the secondary cutting line CL2 to be subjected to the secondary cutting process may be a position between the substrate 110 and the test pad substrates 110T. In other words, the substrate 110 is not present at the secondary cutting line CL2 to be subjected to the secondary cutting process. Accordingly, the secondary cutting process may be easily and advantageously performed.

Referring to FIGS. 1 and 2, the reason that the substrate 110 is not present at the secondary cutting line CL2 is that the substrate 110 is etched at a position corresponding to the secondary cutting line CL2 during the mother substrate manufacturing process and the etching hole EH is formed in the substrate 110. In this case, the formed etching hole EH of the substrate 110 may correspond to the position of the secondary cutting line CL2.

Still referring to FIGS. 1 and 2, the display panel 100 of the display device according to the exemplary embodiments of the present disclosure may further include a first lower etching stopper layer 200 disposed between the substrate 110 and the test line TL in order to secure etching process stability.

Even when the etching process is in progress, due to the first lower etching stopper layer 200, the test line TL, and the like located on the first lower etching stopper layer 200 may be prevented from being damaged by an etchant.

Referring to FIG. 2, the test line TL may be disposed on the first lower etching stopper layer 200, and an inorganic insulating film 210 may be disposed on the test line TL. The signal line SL may be disposed on the inorganic insulating film 210 and may be connected to the test line TL via a through hole of the inorganic insulating film 210. Various layers 220 may be disposed on the inorganic insulating film 210.

As described above, from the viewpoint of a final product after the secondary cutting process, in the display panel 100 of the display device according to the exemplary embodiments of the present disclosure, a rear surface edge of the substrate 110 is etched, and the display panel 100 may include the first lower etching stopper layer 200 disposed between the substrate 110 and the test line TL.

As described above, in the display panel 100 of the display device according to the exemplary embodiments of the present disclosure, the rear surface edge of the substrate 110 may be etched to facilitate the secondary cutting process, and the display panel 100 may include the first lower etching stopper layer 200 in order to secure etching process stability.

In order to further secure etching process stability, the display panel 100 of the display device according to the exemplary embodiments of the present disclosure may have a multi-etching stopper structure further including the first lower etching stopper layer 200 and one or more additional etching stopper layers. Hereinafter, the multi-etching stopper structure of the display panel 100 of the display device according to the exemplary embodiments of the present disclosure will be described in detail.

Figure 3:
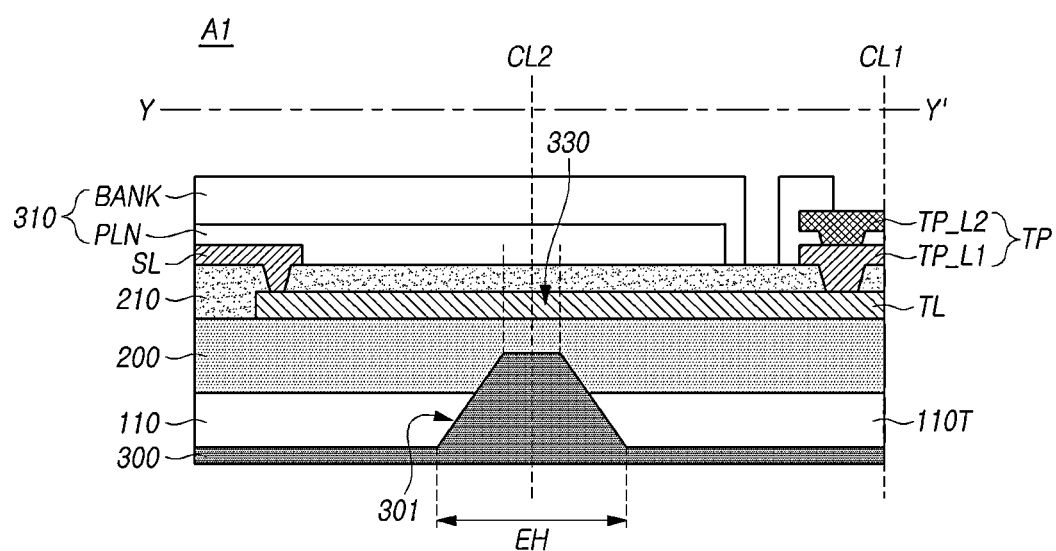
FIG. 3 is an example of a cross-sectional view taken along line Y-Y' in an area A1 of FIGS. 1 and 2.
Figure 4:
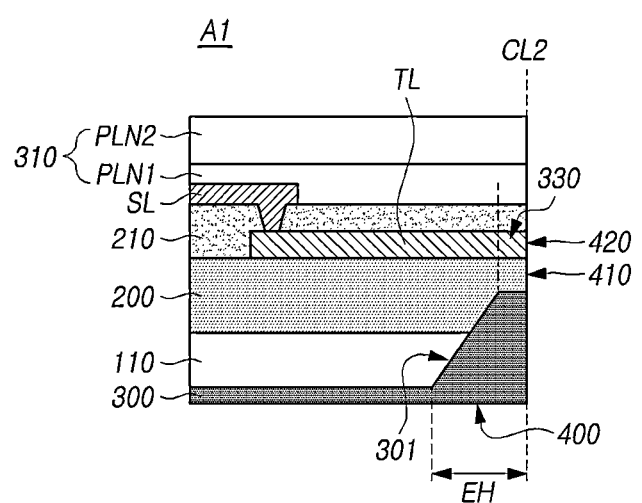
FIG. 4 is an example of a cross-sectional view after a secondary cutting process is performed along a secondary cutting line of FIG. 3.

FIG. 3 is an example of a cross-sectional view taken along line Y-Y' in an area A1 of FIGS. 1 and 2, and FIG. 4 is an example of a cross-sectional view after a secondary cutting process is performed along a secondary cutting line CL2 of FIG. 3.

In other words, FIG. 3 is an example of a cross-sectional view of a display panel 100 in a state before the secondary cutting process is performed, and FIG. 4 is an example of a cross-sectional view of a display panel 100 in a state after the secondary cutting process is performed.

Referring to FIG. 3, the display panel 100 in the state before the secondary cutting process is performed may include a substrate 110 including a display area DA and a non-display area NDA, a signal line SL disposed in the display area DA of the substrate 110, a test line TL disposed in the non-display area NDA of the substrate 110 and connected to the signal line SL, and a first lower etching stopper layer 200 disposed between the substrate 110 and the test line TL.

Referring to FIG. 3, in the display panel 100 in the state before the secondary cutting process is performed, the substrate 110 and a test pad substrate 110T are spaced apart from each other, and an etching hole EH formed by etching a mother substrate may be present between the substrate 110 and the test pad substrate 110T. An area in which the etching hole EH is present is referred to as an etching area EA.

Referring to FIG. 3, in the etching area EA, a side surface 301 of the substrate 110 and a side surface of the test pad substrate 110T may become closer from bottom to top. In other words, the substrate 110 may have a first tapered shape that increases from bottom to top. The test pad substrate 110T may also have the first tapered shape that increases from bottom to top. In one or more examples, a size of the etching hole EH of FIG. 3 may be larger at the bottom compared to the top.

Referring to FIG. 3, the display panel 100 in the state before the secondary cutting process is performed may further include a back coating film 300 disposed on a rear surface of the substrate 110 and the test pad substrate 110T.

Referring to FIG. 3, for example, the back coating film 300 may include an organic film. As such, since the back coating film 300 includes the organic film, the panel manufacturing process may be facilitated, and the possibility of cracks occurring in the display panel 100 may be reduced.

Referring to FIG. 3, in the process of forming the back coating film 300, the back coating film 300 may be interposed into (or placed into) the etching hole EH located between the substrate 110 and the test pad substrate 110T.

Referring to FIG. 3, inside the etching hole EH, the side surface 301 of the substrate 110 and the side surface of the test pad substrate 110T may have the first tapered shape at a predetermined angle rather than a vertical shape, and the side surface of the back coating film 300 may have a second tapered shape opposite to the first tapered shape. Here, the first tapered shape may be a tapered shape that increases from bottom to top. The second tapered shape may be a tapered shape that decreases from bottom to top.

Referring to FIG. 3, the test line TL may include a portion 330 that does not overlap the substrate 110 and the test pad substrate 110T.

Referring to FIG. 3, the display panel 100 in the state before the secondary cutting process is performed may further include an inorganic insulating film 210 disposed on the test line TL. The signal line SL may be disposed on the inorganic insulating film 210 and may be connected to the test line TL via a through hole of the inorganic insulating film 210.

Referring to FIG. 3, the display panel 100 in the state before the secondary cutting process is performed may further include an upper etching stopper layer 310 disposed on the signal line SL. The upper etching stopper layer 310 may protect various signal lines SL and electrodes disposed above the upper etching stopper layer 310 from an etchant.

The upper etching stopper layer 310 may include an organic film such as polyimide (PI).

The upper etching stopper layer 310 may include a planarization film PLN and a bank BANK.

Referring to FIG. 3, on an upper position of the test pad substrate 110T, the test pad TP is disposed on the inorganic insulating film 210 and may be connected to the test line TL via a through hole of the inorganic insulating film 210. The test pad TP may include a first test pad layer TP_L1 and a second test pad layer TL_L2. The first test pad layer TP_L1 may be the same material layer as the signal line SL.

Referring to FIGS. 3 and 4, the secondary cutting process may be performed along the secondary cutting line CL2 located at a center or near the center of the etching hole EH.

Accordingly, when the secondary cutting process is performed, the substrate 110 and the test pad substrate 110T may be separated. Accordingly, the test pads TP are separated from the final display panel 100.

Referring to FIG. 4, in the area A1 of the display panel 100 in the state in which the secondary cutting process is completed, a rear surface edge 301 of the substrate 110 may have a chamfered shape.

Referring to FIG. 4, in the area A1 of the display panel 100 in the state in which the secondary cutting process is completed, the rear surface edge 301 of the substrate 110 may be located further inside than an outer edge 410 of the first lower etching stopper layer 200.

In other words, an outer end of the test line TL may include the portion 330 that does not overlap the substrate 110. At the outer end of the test line TL, the portion 330 that does not overlap the substrate 110 may be located further outside than the rear surface edge 301 of the substrate 110.

Referring to FIG. 4, an outer side edge of the test line TL may have a cut surface 420 in a cut form. The cut surface 420 of the outer side edge of the test line TL may be located further outside than the rear surface edge 301 of the substrate 110.

In the display panel 100 in the state in which the secondary cutting process is completed, the cut surface 420 of the outer side edge of the test line TL may be present in a state of being exposed. Accordingly, the cut surface 420 of the outer side edge of the test line TL may be in a state of being aligned with a cut surface 410 of the outer side surface of the first lower etching stopper layer 200.

Referring to FIG. 4, in the display panel 100 in the state in which the secondary cutting process is completed, the rear surface edge 301 of the substrate 110 has a chamfered shape, and thus the rear surface edge 301 of the substrate 110 may have the first tapered shape.

In the display panel 100 in the state in which the secondary cutting process is completed, the side edge of the first lower etching stopper layer 200 may have the first tapered shape corresponding to the rear surface edge 301 of the substrate 110 only up to a predetermined height from the rear surface (e.g., the rear surface of the first lower etching stopper layer 200).

In the display panel 100 in the state in which the secondary cutting process is completed, the back coating film 300 may be disposed along the rear surface and the rear surface edge 301 of the substrate 110. A rear surface edge 400 of the back coating film 300 may not have a tapered shape at a predetermined angle but may have a right angle shape.

Referring to FIGS. 3 and 4, in one or more example embodiments, a thickness of the first lower etching stopper layer 200 should be designed so as not to be penetrated by an etching process. The thickness of the first lower etching stopper layer 200 may vary depending on the type of etchant, and may vary depending on a material of the first lower etching stopper layer 200. For example, the thickness of the first lower etching stopper layer 200 may be equal to or greater than 5000 angstroms (Å).

Referring to FIGS. 3 and 4, the thickness of the first lower etching stopper layer 200 may be a separation distance between an upper surface of the substrate 110 and the test line TL.

Figure 5:
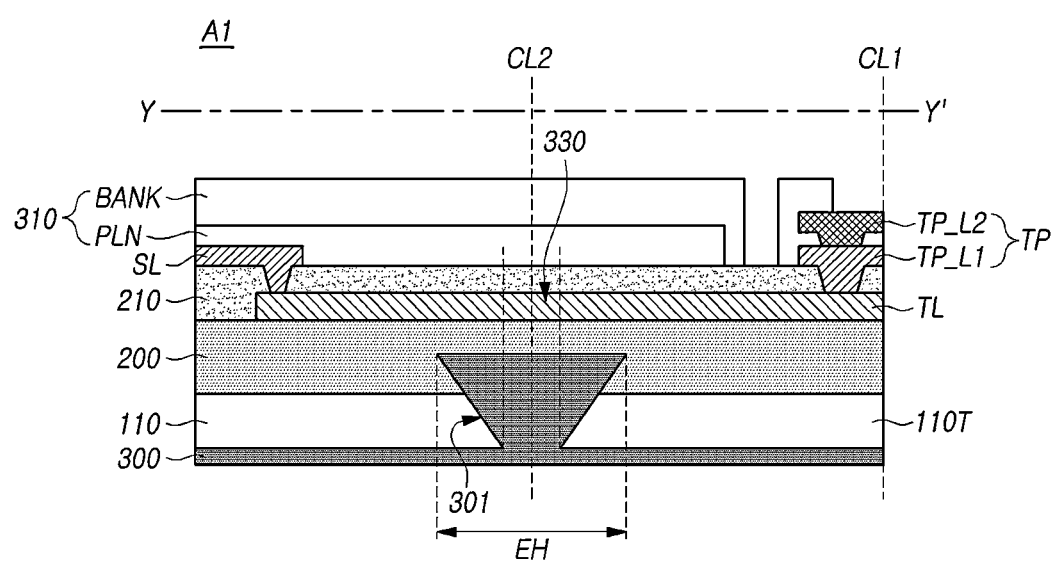
FIG. 5 is an example of another cross-sectional view taken along line Y-Y' in the area A1 of FIGS. 1 and 2.
Figure 6:
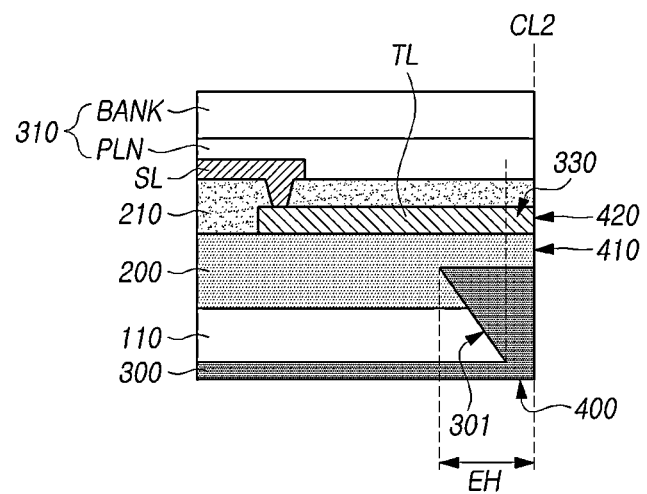
FIG. 6 is an example of a cross-sectional view after a secondary cutting process is performed along a secondary cutting line of FIG. 5.

FIG. 5 is an example of another cross-sectional view taken along line Y-Y' in the area A1 of FIGS. 1 and 2, and FIG. 6 is an example of a cross-sectional view after a secondary cutting process is performed along a secondary cutting line CL2 of FIG. 5. However, the cross-sectional view of FIG. 5 may correspond to the cross-sectional view of FIG. 3, and the cross-sectional view of FIG. 6 may correspond to the cross-sectional view of FIG. 4. Accordingly, in describing the cross-sectional structures in FIGS. 5 and 6, portions having differences from the cross-sectional structures in FIGS. 3 and 4 will be mainly described.

The cross-sectional structures of FIGS. 5 and 6 are different from the cross-sectional structures of FIGS. 2 and 4 in that the substrate 110 and the first lower etching stopper layer 200 of FIGS. 5 and 6 have the second tapered shape of an etched side surface by an etching process, and the rest are all the same. Here, the first tapered shape may be a tapered shape that increases from bottom to top. The second tapered shape may be a tapered shape that decreases from bottom to top. In one or more examples, a size of the etching hole EH of FIG. 5 may be smaller at the bottom compared to the top. In one or more examples, a forward tapered shape may be a first tapered shape or a tapered shape that increases from bottom to top. In one or more examples, a reverse tapered shape may be a second tapered shape or a tapered shape that decreases from bottom to top.

Referring to FIG. 6, in the display panel 100 in the state in which the secondary cutting process is completed, the rear surface edge 301 of the substrate 110 may have the second tapered shape that decreases from bottom to top.

Referring to FIG. 6, in the display panel 100 in the state in which the secondary cutting process is completed, the side edge of the first lower etching stopper layer 200 may have the second tapered shape corresponding to the rear surface edge 301 of the substrate 110 only up to a predetermined height from the rear surface (e.g., the rear surface of the first lower etching stopper layer 200).

In the display panel 100 in the state in which the secondary cutting process is completed, the back coating film 300 may be disposed along the rear surface and the rear surface edge 301 of the substrate 110. The rear surface edge 400 of the back coating film 300 may not have a tapered shape at a predetermined angle but may have a right angle shape.

Figure 7:
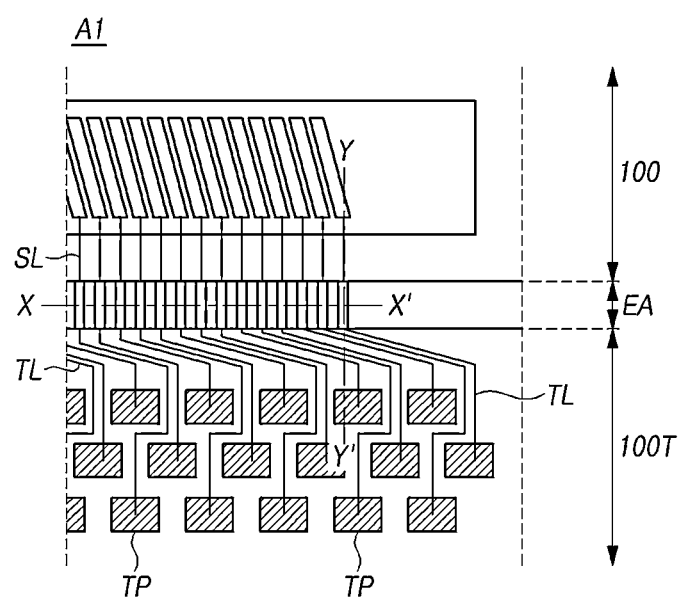
FIG. 7 is an example of a plan view of the area A1 of FIGS. 1 and 2.

FIG. 7 is an example of a plan view of the area A1 of FIGS. 1 and 2.

Referring to FIG. 7, in the area A1 of FIGS. 1 and 2, the substrate 110 and the test pad substrate 110T may be present in a state of being spaced apart from each other, and the etching area EA may be present between the substrate 110 and the test pad substrate 110T.

Referring to FIG. 7, a plurality of signal lines SL may be disposed on the substrate 110, and a plurality of test pads TP may be disposed on the test pad substrate 110T.

Referring to FIG. 7, the plurality of test lines TL may connect the plurality of signal lines SL disposed on the substrate 110 with the plurality of test pads TP disposed on the test pad substrate 110T one-to-one. In one or more examples, each of the plurality of signal lines SL may be connected to a respective one of the plurality of test lines TL. In one or more examples, each of the plurality of test lines TL may be connected to a respective one of the plurality of test pads TP.

Hereinafter, a cross-sectional structure taken along line Y-Y' of FIG. 7 will be described with reference to FIGS. 8 and 9. Cross-sectional structures of FIGS. 8 and 9 may be viewed as another exemplary embodiment of the cross-sectional structures of FIGS. 3 and 4. In addition, a cross-sectional structure taken along line X-X' of FIG. 7 will be described with reference to FIG. 10.

Figure 8:
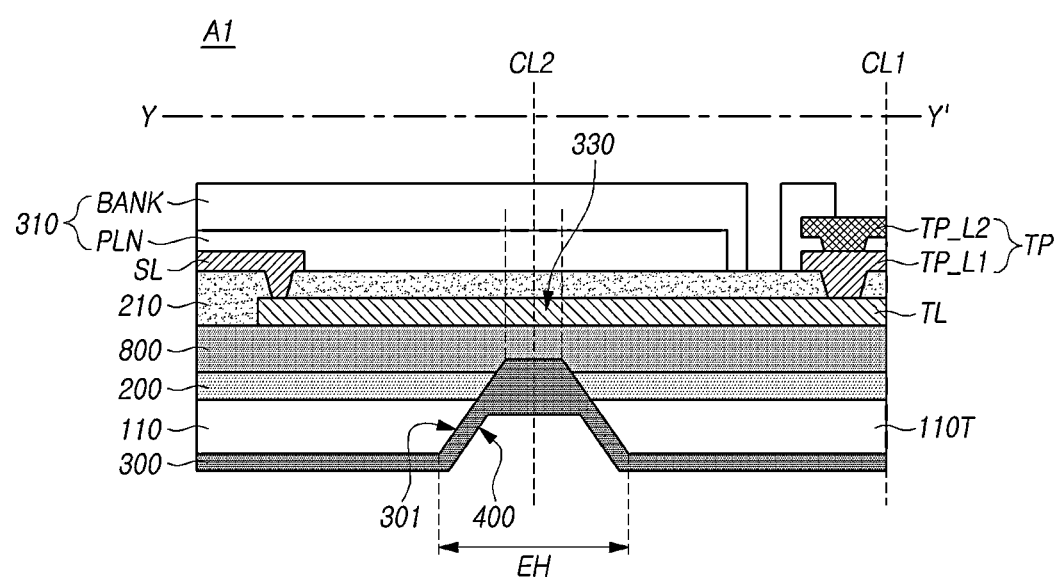
FIG. 8 is an example of a cross-sectional view taken along line Y-Y' in an area A1 of FIG. 7.
Figure 9:
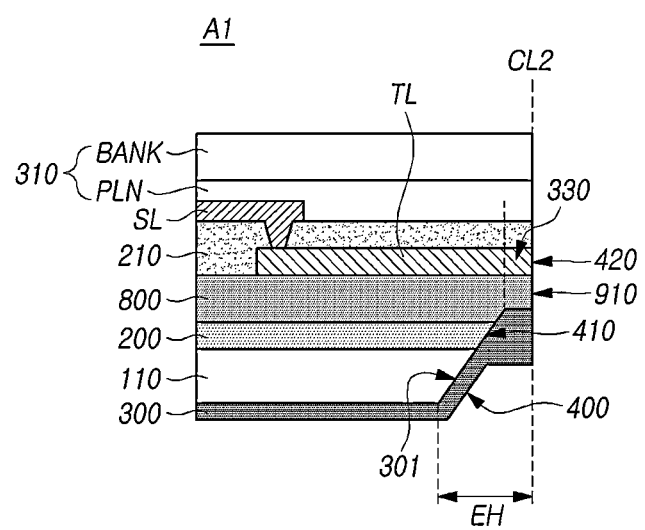
FIG. 9 is an example of a cross-sectional view after a secondary cutting process is performed along a secondary cutting line of FIG. 8.

FIG. 8 is an example of a cross-sectional view taken along line Y-Y' in the area A1 of FIG. 7, and FIG. 9 is an example of a cross-sectional view after a secondary cutting process is performed along a secondary cutting line CL2 of FIG. 8. However, the cross-sectional view of FIG. 8 may correspond to the cross-sectional view of FIG. 3, and the cross-sectional view of FIG. 9 may correspond to the cross-sectional view of FIG. 4. Accordingly, in describing the cross-sectional structures in FIGS. 8 and 9, portions having differences from the cross-sectional structures in FIGS. 3 and 4 will be mainly described.

Referring to FIG. 8, in the display panel 100 in the state before the secondary cutting process is performed, an etching hole EH may be present between the substrate 110 and the test pad substrate 110T by an etching process of the mother substrate.

Referring to FIG. 8, in the display panel 100 in the state before the secondary cutting process is performed, a back coating film 300 may be coated on the rear surface of the mother substrate in which the etching hole EH is formed. Accordingly, the back coating film 300 may be coated on the rear surface of the substrate 110 and the rear surface of the test pad substrate 110T, and the back coating film 300 may also be coated on the side surface 301 of the substrate 110 and the side surface of the test pad substrate 110T in the etching hole EH.

Referring to FIG. 8, in the display panel 100 in the state before the secondary cutting process is performed, the outer surface 400 of the back coating film 300 inside the etching hole EH may have the same shape as the side surface 301 of the substrate 110 and the side surface of the test pad substrate 110T.

Referring to FIG. 8, the display panel 100 in the state before the secondary cutting process is performed may further include a second lower etching stopper layer 800 disposed between the first lower etching stopper layer 200 and the test line TL.

Referring to FIG. 8, in the display panel 100 in the state before the secondary cutting process is performed, the first lower etching stopper layer 200 may have a groove formed as much as a partial thickness or may have a hole that completely passes therethrough. In one or more examples, the first lower etching stopper layer 200 may have a groove that extends through a partial thickness of the first lower etching stopper layer 200 or may have a groove or a hole that extends through the entire thickness of the first lower etching stopper layer 200. The second lower etching stopper layer 800 may have no groove due to etching or may have a groove formed by etching at a predetermined height from the rear surface thereof (e.g., a groove that extends up to a partial thickness of the second lower etching stopper layer 800).

The thickness of the first lower etching stopper layer 200 in FIG. 8 may be the same as the thickness of the first lower etching stopper layer 200 in FIG. 3.

Alternatively, the thickness of the first lower etching stopper layer 200 in FIG. 8 may be thinner than the thickness of the first lower etching stopper layer 200 in FIG. 3. Conversely, the sum of the thicknesses of the first lower etching stopper layer 200 and the second lower etching stopper layer 800 in FIG. 8 may be the same as the thickness of the first lower etching stopper layer 200 in FIG. 3.

Referring to FIG. 8, in the display panel 100 in the state before the secondary cutting process is performed, each of the first lower etching stopper layer 200 and the second lower etching stopper layer 800 may include an inorganic film. For example, the inorganic film may include SiOx, SiNx, a-Si, or a combination thereof.

Referring to FIG. 8, the display panel 100 in the state before the secondary cutting process is performed may further include an upper etching stopper layer 310 disposed on the signal line SL, and the upper etching stopper layer 310 may include an organic film.

Referring to FIG. 9, in the display panel 100 in the state in which the secondary cutting process is completed, the rear surface edge 400 of the back coating film 300 may have the same tapered shape as the rear surface edge 301 of the substrate 110.

Referring to FIG. 9, the display panel 100 in the state in which the secondary cutting process is completed may further include a second lower etching stopper layer 800 disposed between the first lower etching stopper layer 200 and the test line TL.

Referring to FIG. 9, in the display panel 100 in the state in which the secondary cutting process is completed, the outer side edge of the test line TL may have a cut surface 420 in a cut form. The cut surface 420 of the outer side edge of the test line TL may be in a state of being aligned with a cut surface 910 of the outer side surface of the second lower etching stopper layer 800.

Referring to FIG. 9, in the display panel 100 in the state in which the secondary cutting process is completed, each of the first lower etching stopper layer 200 and the second lower etching stopper layer 800 may include an inorganic film.

Referring to FIG. 9, the display panel 100 in the state in which the secondary cutting process is completed may further include an upper etching stopper layer 310 disposed on the signal line SL, and the upper etching stopper layer 310 may include an organic film.

Figure 10:
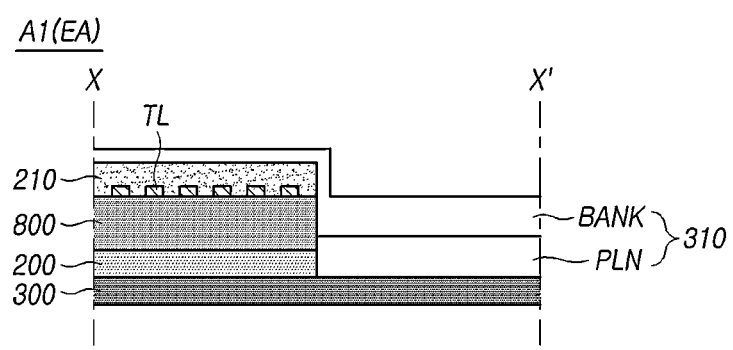
FIG. 10 is an example of a cross-sectional view taken along line X-X' in the area A1 of FIG. 7.

FIG. 10 is an example of a cross-sectional view taken along line X-X' in the area A1 of FIG. 7.

Referring to FIG. 10, the area A1 of FIG. 7 may include an area (an area marked with line X-X') crossing the plurality of test lines TL, and this area may be an area included in the etching area EA.

Referring to FIG. 10, in the etching area EA in the area A1, the substrate 110 is not present.

Referring to FIG. 10, in the etching area EA in the area A1, the back coating film 300 may be disposed at the bottom, and the first lower etching stopper layer 200 may be disposed on the back coating film 300. The second lower etching stopper layer 800 may be disposed on the first lower etching stopper layer 200, and the plurality of test lines TL may be arranged on the second lower etching stopper layer 800.

Referring to FIG. 10, in the etching area EA in the area A1, an inorganic insulating film 210 may be disposed in a form of covering the plurality of test lines TL.

Referring to FIG. 10, the upper etching stopper layer 310 may be disposed on top and side surfaces of the inorganic insulating film 210. The upper etching stopper layer 310 may include a planarization film PLN and a bank BANK. At a position where the test lines TL are not present, the upper etching stopper layer 310 may be directly disposed on the back coating film 300.

Figure 11:
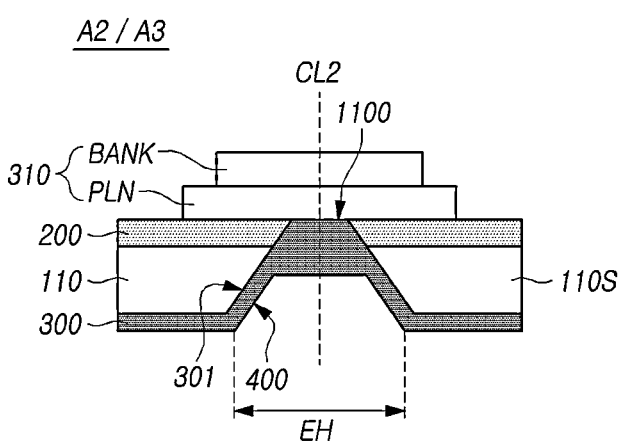
FIG. 11 is an example of a cross-sectional view of an area A2 or area A3 of FIGS. 1 and 2.
Figure 12:
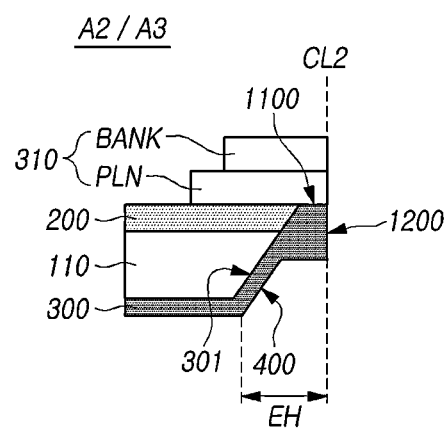
FIG. 12 is an example of a cross-sectional view after a primary cutting process or a secondary cutting process is performed along a primary cutting line or a secondary cutting line of FIG. 11.

FIG. 11 is an example of a cross-sectional view illustrating an area A2 or A3 of FIGS. 1 and 2, and FIG. 12 is an example of a cross-sectional view after a primary cutting process or a secondary cutting process is performed along a primary cutting line CL1 or a secondary cutting line CL2 of FIG. 11. However, the area A2 may be an area primarily cut along the primary cutting line CL1, and the area A3 may be an area secondarily cut along the secondary cutting line CL2. However, hereinafter, for convenience of description, the secondary cutting along the secondary cutting line CL2 will be mainly described.

Referring to FIG. 11, the area A2 or area A3 of the display panel 100 in the state before the secondary cutting process is performed may include a substrate 110 including a display area DA and a non-display area NDA, a first lower etching stopper layer 200 disposed on the substrate 110, and a back coating film 300 disposed on a rear surface of the substrate 110 and an outer side surface of the substrate 110.

Referring to FIG. 11, in the display panel 100 in the state before the secondary cutting process is performed, the back coating film 300 may include an organic film.

Referring to FIG. 11, in the display panel 100 in the state before the secondary cutting process is performed, an etching hole EH may be formed by an etching process, so that the mother substrate may be separated into the substrate 110 and an outer side substrate 110S.

Referring to FIG. 11, in the display panel 100 in the state before the secondary cutting process is performed, the first lower etching stopper layer 200 may have a through hole formed by an etching process.

Referring to FIG. 11, in the display panel 100 in the state before the secondary cutting process is performed, the side surface 301 of the substrate 110 and the side surface of the outer side substrate 110S may have a first tapered shape or a second tapered shape inside the etching hole EH.

Referring to FIG. 11, in the display panel 100 in the state before the secondary cutting process is performed, the back coating film 300 may be disposed along an inner side surface of the etching hole EH.

Referring to FIG. 11, in the display panel 100 in the state before the secondary cutting process is performed, the back coating film 300 may be disposed on the rear surface of the substrate 110 and the rear surface of the outer side substrate 110S. The back coating film 300 may also be disposed on the side surface of the substrate 110 and the side surface of the outer side substrate 110S inside the etching hole EH.

Referring to FIG. 11, the display panel 100 in the state before the secondary cutting process is performed may further include an upper etching stopper layer 310 disposed on the first lower etching stopper layer 200. The first lower etching stopper layer 200 may include an inorganic film, and the upper etching stopper layer 310 may include an organic film.

Referring to FIG. 11, a partial upper surface 1100 of the back coating film 300 may be in contact with a partial rear surface of the upper etching stopper layer 310 via the through hole of the first lower etching stopper layer 200.

Referring to FIG. 12, the area A2 or the area A3 of the display panel 100 in the state in which the secondary cutting process is completed may include a substrate 110 including a display area DA and a non-display area NDA, a first lower etching stopper layer 200 disposed on the substrate 110, and a back coating film 300 disposed on a rear surface of the substrate 110 and an outer side surface of the substrate 110.

Referring to FIG. 12, in the display panel 100 in the state in which the secondary cutting process is completed, the back coating film 300 may include an organic film.

Referring to FIG. 12, in the display panel 100 in the state in which the secondary cutting process is completed, an outer side edge 1200 of the back coating film 300 may be located further outside than the rear surface edge 301 of the substrate 110.

Referring to FIG. 12, in the display panel 100 in the state in which the secondary cutting process is completed, the rear surface edge 301 of the substrate 110 may have a first tapered shape or a second tapered shape.

Referring to FIG. 12, in the display panel 100 in the state in which the secondary cutting process is completed, the rear surface edge 400 of the back coating film 300 may have the same tapered shape as the rear surface edge 301 of the substrate 110.

On the other hand, in an alternative example embodiment, in the display panel 100 in the state in which the secondary cutting process is completed, the rear surface edge 400 of the back coating film 300 may not have a tapered shape at a predetermined angle, but may have a right angle shape, as shown in FIG. 4.

Referring to FIG. 12, the display panel 100 in the state in which the secondary cutting process is completed may further include an upper etching stopper layer 310 disposed on the first lower etching stopper layer 200. The first lower etching stopper layer 200 may include an inorganic film, and the upper etching stopper layer 310 may include an organic film.

Referring to FIG. 12, in the display panel 100 in the state in which the secondary cutting process is completed, a partial upper surface 1100 of the back coating film 300 may be in contact with a partial rear surface of the upper etching stopper layer 310.

Figure 13:
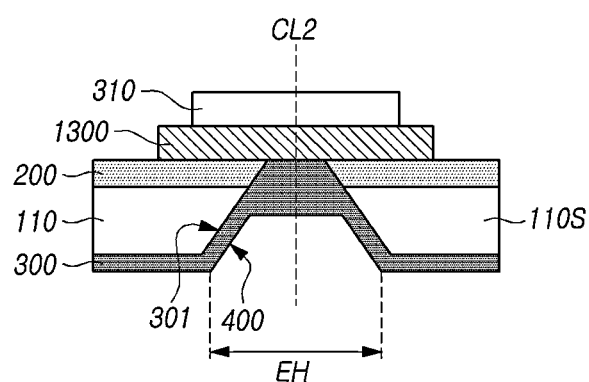
FIG. 13 is an example of a cross-sectional view of the area A2 or area A3 of FIGS. 1 and 2.
Figure 14:
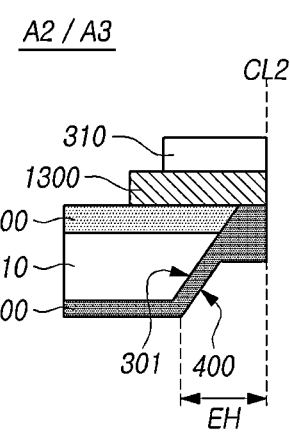
FIG. 14 is an example of a cross-sectional view after a primary cutting process or a secondary cutting process is performed along a primary cutting line or a secondary cutting line of FIG. 13.

FIG. 13 is an example of a cross-sectional view of the area A2 or A3 of FIGS. 1 and 2, and FIG. 14 is an example of a cross-sectional view after a primary cutting process or a secondary cutting process is performed along a primary cutting line CL1 or a secondary cutting line CL2 of FIG. 13. However, the cross-sectional view of FIG. 13 may correspond to the cross-sectional view of FIG. 11, and the cross-sectional view of FIG. 14 may correspond to the cross-sectional view of FIG. 12. Accordingly, in describing the cross-sectional structures in FIGS. 13 and 14, portions having differences from the cross-sectional structures in FIGS. 11 and 12 will be mainly described.

Referring to FIGS. 13 and 14, the display panel 100 in the state before or after the secondary cutting process may further include an intermediate etching stopper layer 1300 disposed between the first lower etching stopper layer 200 and the upper etching stopper layer 310. For example, the intermediate etching stopper layer 1300 may include a metal film. For example, the metal film may include Mo, MoTi, ITO, or a combination thereof.

FIGS. 15A to 15F are views illustrating a manufacturing method of a display device according to exemplary embodiments of the present disclosure.

Referring to FIGS. 15A to 15F, as a manufacturing process of a display device according to the exemplary embodiments of the present disclosure, a mother substrate manufacturing process including operations S10, S20, and S30, a primary cutting process S40, an auto probe process S50, a secondary cutting process S60, a module input process, and the like may be performed.

Figure 15A:
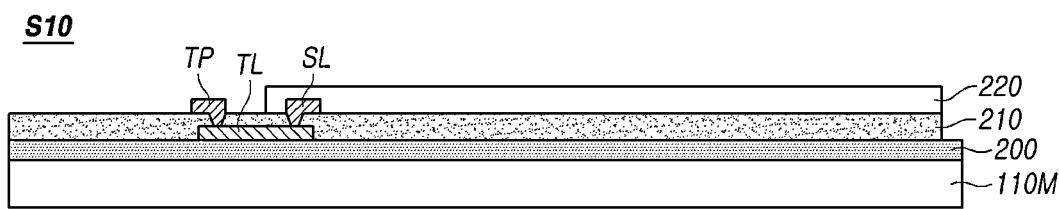
FIGS. 15A to 15F are views illustrating a manufacturing method of a display device according to exemplary embodiments of the present disclosure.

Referring to FIG. 15A, in operation S10 of the mother substrate manufacturing process, metals corresponding to various electrodes or lines and various insulating films may be formed on a mother substrate 110M. In this case, signal lines SL, test lines TL, and test pads TP, and the like may be patterned on a mother substrate for each panel unit area.

Referring to FIG. 15A, in operation S10 of the mother substrate manufacturing process, a first lower etching stopper layer 200 may be deposited between the mother substrate 110M and the test lines TL. The first lower etching stopper layer 200 may be an inorganic film including an inorganic material.

Figure 15B:
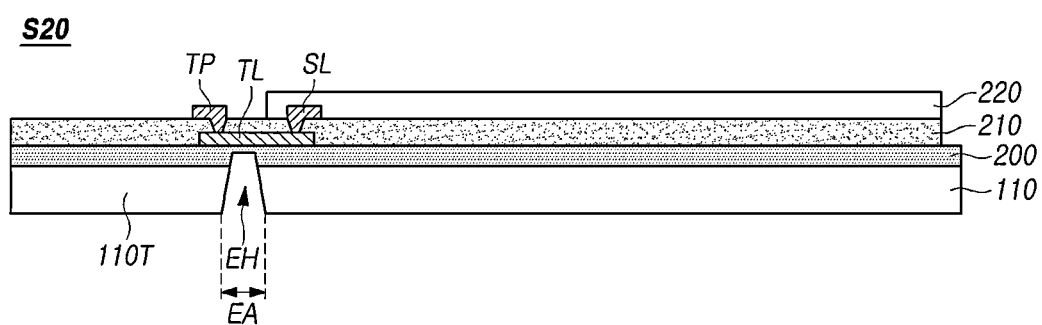

Referring to FIG. 15B, in operation S20 (etching process operation) of the mother substrate manufacturing process, an etching area EA of the mother substrate 110M may be etched for each panel unit area. Accordingly, for each panel unit area, an etching hole EH may be formed in the etching area EA of the mother substrate 110M, and the mother substrate 110M may be divided into a substrate 110 and a test pad substrate 110T spaced apart from the substrate 110.

The etching area EA of the mother substrate 110M refers to an area between the substrate 110 and the test pad substrate 110T, and no substrate is present in this etching area EA. The etching hole EH of the mother substrate 110M formed in the etching area EA may be formed at a position corresponding to a secondary cutting line CL2 to be subjected to a secondary cutting process. As described above, since no substrate is present at the secondary cutting line CL2 to be subjected to the secondary cutting process, the secondary cutting process may be facilitated. Although not shown in the drawings, the substrate in an area overlapping a primary cutting line CL1 (refer to FIG. 15D) may also be etched to facilitate a primary cutting process.

Referring to FIG. 15B, in operation S20 (etching process operation) of the mother substrate manufacturing process, in the first lower etching stopper layer 200, there is the possibility that only a slight groove is formed by etching, but no through hole is formed.

Figure 15C:
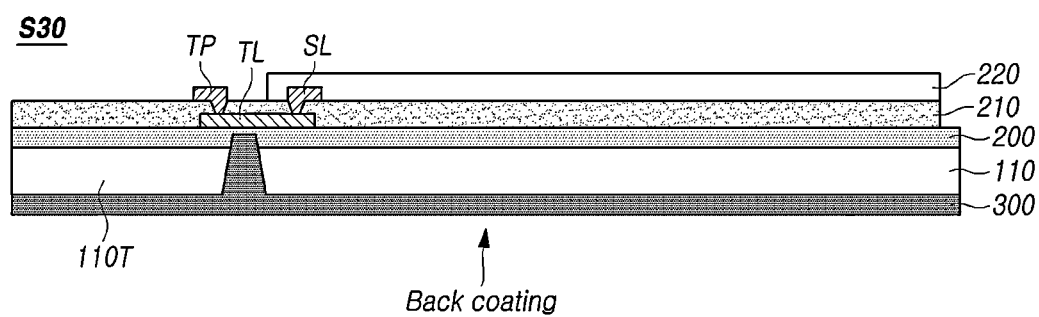

Referring to FIG. 15C, in operation S30 (back coating process operation) of the mother substrate manufacturing process, a back coating film 300 may be coated on rear surfaces of the substrate 110 and the test pad substrate 110T. The back coating film 300 may include an organic material.

Figure 15D:
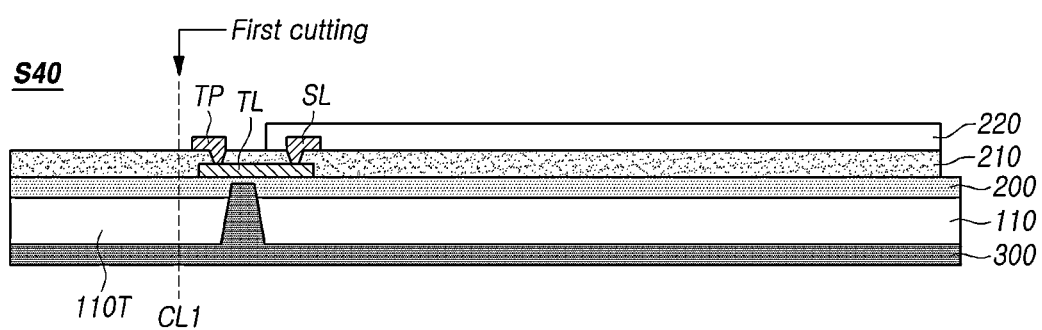

Referring to FIG. 15D, in operation S40, which is a primary cutting process operation, an outer portion of the test pad substrate 110T may be cut along the primary cutting line CL1.

Figure 15E:
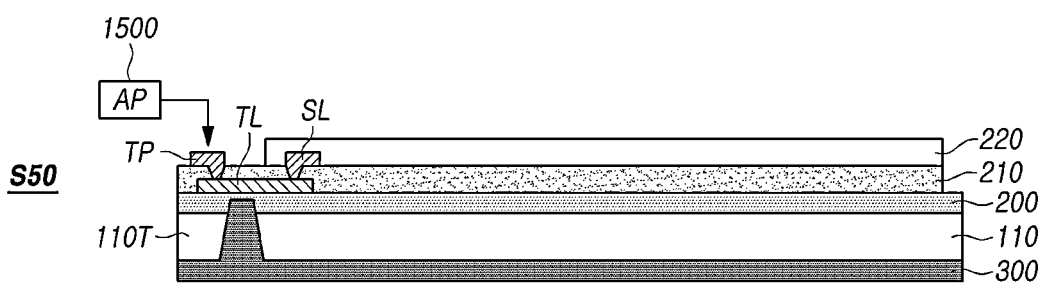

Referring to FIG. 15E, in operation S50, which is an auto probe process operation, a test signal may be supplied to the signal lines SL through the test pads TP using an auto probe device 1500, and a test (lighting test) may be performed to test whether sub-pixels SP are normally (or properly) driven to emit light.

Figure 15F:
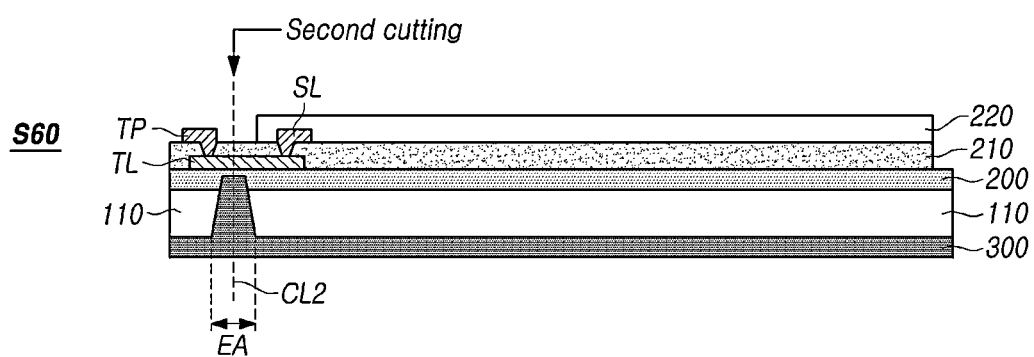

Referring to FIG. 15F, in operation S60, which is the second cutting process operation, the substrate 110 and the test pad substrate 110T may be separated by cutting the display panel 100 along the secondary cutting line CL2 corresponding to the etching hole EH of the substrate 110. Here, the secondary cutting line CL2 may correspond to the etching area EA, that is, an etching hole formation area. The secondary cutting line CL2 may correspond to an outer edge of the display panel 100 in a state in which panel manufacturing is finally completed.

Thereafter, a module input process may be performed based on the substrate 110 separated from the test pad substrate 110T, so that the manufacturing process of the display panel 100 and the display device may be completed.

The manufacturing method of the display device according to the above-described exemplary embodiments of the present disclosure will be briefly described again as follows.

Referring to FIGS. 15A to 15F, in the manufacturing method of the display device according to the exemplary embodiments of the present disclosure, the first lower etching stopper layer 200 is disposed on the mother substrate 110M, the test line TL is disposed on the first lower etching stopper layer 200, the inorganic insulating film 210 is disposed on the test line TL, the through hole of the inorganic insulating film 210 is formed, the signal line SL and the test pad TP are disposed on the inorganic insulating film 210, the signal line SL is connected to one end of the test line TL via the through hole of the inorganic insulating film 210, and the test pad TP is connected to the other end of the test line TL via another through hole of the inorganic insulating film 210, and the method of manufacturing the display device according to the exemplary embodiments of the present disclosure may include operation S10 of manufacturing the mother substrate, operation S20 of separating the mother substrate 110M into the substrate 110 and the test pad substrate 110T by etching the rear surface of the mother substrate 110M to form the etching hole EH, and operation S30 of coating the back coating film 300 on the rear surface of the mother substrate 110M.

Referring to FIGS. 15A to 15F, the manufacturing method of the display device according to the exemplary embodiments of the present disclosure may further include operation S50 of performing the auto probe (AP) process through the test line TL, and operation S60 of removing the test pad substrate 110T by performing a cutting process along the secondary cutting line CL2 corresponding to the etching hole EH, after operation S30 of coating the back coating film 300. An inner side surface of the etching hole EH in the rear surface of the substrate 110 may have a tapered shape.

Referring to FIGS. 15A to 15F, in operation S10, the second lower etching stopper layer 800 disposed between the first lower etching stopper layer 200 and the test line TL may be disposed after the first lower etching stopper layer 200 is disposed.

Referring to FIGS. 15A to 15F, in operation S10, the upper etching stopper layer 310 may be further disposed on the signal line SL after the signal line SL is connected to the test line TL.

The exemplary embodiments of the present disclosure described above will be briefly described as follows.

A display device according to exemplary embodiments of the present disclosure may include a substrate including a display area and a non-display area, a signal line disposed in the display area of the substrate, a test line disposed in the non-display area of the substrate and connected to the signal line, and a first lower etching stopper layer disposed between the substrate and the test line.

In the display device according to the exemplary embodiments of the present disclosure, a rear surface edge of the substrate is located further inside than an outer side edge of the first lower etching stopper layer, and an end of the test line is located further outside than the rear surface edge of the substrate, so that a portion which does not overlap the substrate may be included.

The display device according to the exemplary embodiments of the present disclosure may further include a back coating film disposed on the rear surface of the substrate and including an organic film.

In the display device according to the exemplary embodiments of the present disclosure, the rear surface edge of the substrate may have a tapered shape.

In the display device according to the exemplary embodiments of the present disclosure, a rear surface edge of the back coating film may not have a tapered shape at a predetermined angle but may have a right angle shape, or the rear surface edge of the back coating film may have the same tapered shape as the rear surface edge of the substrate.

In the display device according to the exemplary embodiments of the present disclosure, a side edge of the first lower etching stopper layer may have a tapered shape only up to a predetermined height from the rear surface (e.g., the rear surface of the first lower etching stopper layer 200).

The display device according to the exemplary embodiments of the present disclosure may further include an inorganic insulating film disposed on the test line, and the signal line may be disposed on the inorganic insulating film and connected to the test line via a through hole of the inorganic insulating film.

The display device according to the exemplary embodiments of the present disclosure may further include a second lower etching stopper layer disposed between the first lower etching stopper layer and the test line.

In the display device according to the exemplary embodiments of the present disclosure, an outer side edge of the test line may have a cut surface in a cut form, and the cut surface of the outer side edge of the test line may be in a state being aligned with the cut surface of the outer side surface of the first lower etching stopper layer or the second lower etching stopper layer.

The display device according to the exemplary embodiments of the present disclosure may further include an upper etching stopper layer disposed on the signal line.

In the display device according to the exemplary embodiments of the present disclosure, each of the first lower etching stopper layer and the second lower etching stopper layer may include an inorganic film, and the upper etching stopper layer may include an organic film.

A display device according to exemplary embodiments of the present disclosure may include a substrate including a display area and a non-display area, a first lower etching stopper layer disposed on the substrate, and a back coating film disposed on a rear surface and an outer side surface of the substrate.

In the display device according to the exemplary embodiments of the present disclosure, an outer side edge of the back coating film may be located further outside than a rear surface edge of the substrate.

In the display device according to the exemplary embodiments of the present disclosure, the back coating film may include an organic film.

In the display device according to the exemplary embodiments of the present disclosure, the rear surface edge of the substrate may have a tapered shape.

In the display device according to the exemplary embodiments of the present disclosure, a rear surface edge of the back coating film may not have a tapered shape at a predetermined angle but may have a right angle shape, or the rear surface edge of the back coating film may have the same tapered shape as the rear surface edge of the substrate.

The display device according to the exemplary embodiments of the present disclosure may further include an upper etching stopper layer disposed on the first lower etching stopper layer.

In the display device according to the exemplary embodiments of the present disclosure, a partial upper surface of the back coating film may be in contact with a partial rear surface of the upper etching stopper layer.

In the display device according to the exemplary embodiments of the present disclosure, the first lower etching stopper layer may include an inorganic film, and the upper etching stopper layer may include an organic film.

The display device according to the exemplary embodiments of the present disclosure may further include an intermediate etching stopper layer disposed between the first lower etching stopper layer and the upper etching stopper layer, and the intermediate etching stopper layer may include a metal film.

A manufacturing method of a display device according to exemplary embodiments of the present disclosure may include operations of: disposing a first lower etching stopper layer on a mother substrate; disposing a test line on the first lower etching stopper layer; disposing an inorganic insulating film on the test line; forming a through hole of the inorganic insulating film; disposing a signal line and a test pad on the inorganic insulating film, connecting the signal line with one end of the test line via the through hole of the inorganic insulating film, and connecting the test pad with the other end of the test line via another through hole of the inorganic insulating film; and separating the mother substrate into a substrate and a test pad substrate by etching a rear surface of the mother substrate to form an etch hole.

The manufacturing method of a display device according to the exemplary embodiments of the present disclosure may further include coating a back coating film on the rear surfaces of the substrate and the test pad substrate, after the operation of separating the mother substrate into the substrate and the test pad substrate.

The manufacturing method of a display device according to the exemplary embodiments of the present disclosure may further include operations of: performing an auto probe process through the test line; and removing the test pad substrate by performing a cutting process along a cutting line corresponding to an etching hole after the operation of coating the back coating film. Here, an inner side surface of the etching hole in the rear surface of the substrate may have a tapered shape.

The manufacturing method of a display device according to the exemplary embodiments of the present disclosure may further include disposing a second lower etching stopper layer between the first lower etching stopper layer and the test line, after the operation of disposing the first lower etching stopper layer.

The manufacturing method of a display device according to the exemplary embodiments of the present disclosure may further include disposing an upper etching stopper layer on the signal line after the operation of connecting the signal line to the test line.

According to the exemplary embodiments of the present disclosure described above, a manufacturing method of a display device having a structure (e.g., an external test pad arrangement structure) in which no test pads remain on a substrate of a display panel on which the manufacturing is finally completed and a display device manufactured by the manufacturing method may be provided.

According to the exemplary embodiments of the present disclosure, when a test process is performed during a manufacturing process of a display device, a manufacturing method of a display device having a structure that can simplify a manufacturing process of the display device and a display device manufactured by the manufacturing method may be provided.

According to the exemplary embodiments of the present disclosure, a manufacturing method of a display device having a structure (e.g., a substrate etching hole structure) that can facilitate a cutting process during a manufacturing process of the display device, and a display device manufactured by the manufacturing method may be provided.

According to the exemplary embodiments of the present disclosure, a manufacturing method of a display device having a structure (e.g., an etching stopper layer structure) that can significantly reduce the possibility that main lines are damaged by etching or other operations during a manufacturing process of the display device, and a display device manufactured by the manufacturing method may be provided.

According to the exemplary embodiments of the present disclosure, a manufacturing method of a display device having a structure (e.g., a back coating structure) that can significantly reduce the possibility that a display panel is damaged by cracks, etc., and a display device manufactured by the manufacturing method may be provided.

The above description has been presented to enable any person skilled in the art to make, use and practice the technical features of the present disclosure, and has been provided in the context of a particular application and its requirements as examples. Various modifications, additions and substitutions to the described embodiments will be readily apparent to those skilled in the art, and the principles described herein may be applied to other embodiments and applications without departing from the scope of the present disclosure. The above description and the accompanying drawings provide examples of the technical features of the present invention for illustrative purposes. In other words, the disclosed embodiments are intended to illustrate the scope of the technical features of the present disclosure. Thus, the scope of the present disclosure is not limited to the embodiments shown, but is to be accorded the widest scope consistent with the claims. The scope of protection of the present disclosure should be construed based on the following claims, and all technical features within the scope of equivalents thereof should be construed as being included within the scope of the present disclosure.

What is claimed is:

1. A display device, comprising:
a substrate including a display area and non-display area;
a signal line disposed in the display area of the substrate;
a test line disposed in the non-display area of the substrate and connected to the signal line; and
a first lower etching stopper layer disposed between the substrate and the test line,
wherein a rear surface edge of the substrate is located further inside than an outer side edge of the first lower etching stopper layer, and
an end portion of the test line includes a portion that is located further outside than the rear surface edge of the substrate and does not overlap the substrate.

2. The display device of claim 1, further comprising a back coating film disposed on a rear surface of the substrate and including an organic film.

3. The display device of claim 2, wherein the rear surface edge of the substrate has a forward tapered shape or a reverse tapered shape.

4. The display device of claim 3, wherein a rear surface edge of the back coating film does not have a tapered shape at a predetermined angle but has a right angle shape.

5. The display device of claim 3, wherein a rear surface edge of the back coating film has the same tapered shape as the rear surface edge of the substrate.

6. The display device of claim 3, wherein a side edge of the first lower etching stopper layer has a tapered shape only up to a predetermined height from a rear surface.

7. The display device of claim 1, further comprising an inorganic insulating film disposed on the test line,
wherein the signal line is disposed on the inorganic insulating film and connected to the test line via a through hole of the inorganic insulating film.

8. The display device of claim 1, further comprising a second lower etching stopper layer disposed between the first lower etching stopper layer and the test line.

9. The display device of claim 8, wherein an outer side edge of the test line has a cut surface in a cut form, and
the cut surface of the outer side edge of the test line is in a state of being aligned with a cut surface of an outer side surface of the first lower etching stopper layer or the second lower etching stopper layer.

10. The display device of claim 8, further comprising an upper etching stopper layer disposed on the signal line,
wherein each of the first lower etching stopper layer and the second lower etching stopper layer includes an inorganic film, and the upper etching stopper layer includes an organic film.

* * * * *